United States Patent
Jung

(10) Patent No.: US 7,994,613 B2
(45) Date of Patent: Aug. 9, 2011

(54) SEMICONDUCTOR DEVICE AND METHOD FOR MANUFACTURING THE SAME

(75) Inventor: Oh-Jin Jung, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 242 days.

(21) Appl. No.: 12/263,522

(22) Filed: Nov. 3, 2008

(65) Prior Publication Data

US 2009/0115025 A1    May 7, 2009

(30) Foreign Application Priority Data

Nov. 7, 2007  (KR) .................. 10-2007-0112933

(51) Int. Cl.
*H01L 23/544* (2006.01)

(52) U.S. Cl. .............. 257/620; 257/E21.523; 257/619; 257/758; 438/113; 438/458; 438/462

(58) Field of Classification Search ........... 257/E21.476, 257/E23.002, 619, 620, 750, 758, 774, 776, 257/E21.523; 438/113, 458, 459, 462, 637, 438/977
See application file for complete search history.

(56) References Cited

U.S. PATENT DOCUMENTS

| | | | | |
|---|---|---|---|---|
| 5,831,330 A * | 11/1998 | Chang | ............... | 257/620 |
| 6,022,791 A * | 2/2000 | Cook et al. | ............... | 438/458 |
| 6,365,958 B1 * | 4/2002 | Ibnabdeljalil et al. | ........ | 257/620 |
| 6,366,209 B2 * | 4/2002 | Dishongh et al. | ............. | 340/653 |
| 6,399,897 B1 * | 6/2002 | Umematsu et al. | ........... | 174/261 |
| 6,492,716 B1 * | 12/2002 | Bothra et al. | ................. | 257/678 |
| 6,521,975 B1 * | 2/2003 | West et al. | ................. | 257/620 |
| 6,566,736 B1 * | 5/2003 | Ogawa et al. | ................ | 257/620 |
| 6,605,861 B2 * | 8/2003 | Toyoda | .......................... | 257/620 |
| 6,806,168 B2 * | 10/2004 | Towle et al. | ................. | 438/460 |
| 6,815,821 B2 * | 11/2004 | Yu | ................................ | 257/758 |
| 6,870,265 B2 * | 3/2005 | Kurimoto et al. | ............. | 257/758 |
| 6,876,064 B2 * | 4/2005 | Matumoto et al. | ............ | 257/632 |
| 6,908,841 B2 * | 6/2005 | Burrell et al. | ................. | 438/612 |
| 6,951,801 B2 * | 10/2005 | Pozder et al. | ................. | 438/462 |
| 6,975,017 B2 * | 12/2005 | Towle et al. | ................. | 257/620 |
| 6,998,712 B2 * | 2/2006 | Okada et al. | ................. | 257/758 |
| 2002/0024115 A1 * | 2/2002 | Ibnabdeljalil et al. | ........ | 257/620 |
| 2006/0012012 A1 * | 1/2006 | Wang et al. | ................... | 257/620 |

FOREIGN PATENT DOCUMENTS

JP    2004-235357    8/2004

* cited by examiner

*Primary Examiner* — Chris Chu
(74) *Attorney, Agent, or Firm* — Sherr & Vaughn, PLLC

(57) ABSTRACT

A semiconductor device may include a chip including a chip including a silicon substrate having a semiconductor device area, a pad area and a scribe lane defining an outer contour of the chip. A semiconductor device may be formed in the semiconductor device area, and a pad electrically connected with the semiconductor device may be formed in the pad area. A crack prevention pattern may be formed on an outer contour of the chip, such that the crack prevention pattern extends from a lowest portion to a highest portion of the semiconductor device. A crack prevention pattern is manufactured such that chip cracking can be prevented during the sawing process.

9 Claims, 4 Drawing Sheets

SEMICONDUCTOR DEVICE AND METHOD FOR MANUFACTURING THE SAME

The present application claims priority under 35 U.S.C. 119 to Korean Patent Application No. 10-2007-0112933 (filed on Nov. 7, 2007), which is hereby incorporated by reference in its entirety.

BACKGROUND

After manufacturing a plurality of chips on a wafer, a sawing process may be performed by using a diamond blade rotating at a high speed to cut the wafer into individual chips along a scribe lane of the wafer. In the related sawing process, chipping occurs in a chip due to mechanical stress delivered from the blade. When the mechanical stress becomes strong, a crack may form in a passivation layer and/or an insulating layer, which may cause a chip to malfunction or fail.

SUMMARY

Embodiments relate to a semiconductor and a method for manufacturing the same. Embodiments relate to a semiconductor device having a crack prevention pattern and a method for manufacturing the same.

According to embodiments, a semiconductor device may include a chip including a silicon substrate having a semiconductor device area, a pad area and a scribe lane defining an outer contour of the chip. A semiconductor device may be formed in the semiconductor device area, and a pad electrically connected with the semiconductor device may be formed in the pad area. A crack prevention pattern may be formed on an outer contour of the chip, such that the crack prevention pattern extends from a lowest portion to a highest portion of the semiconductor device.

Embodiments relate to a method for manufacturing a semiconductor device which may include providing a silicon wafer including a plurality of semiconductor chip areas separated and defined by scribe lane areas, such that each chip area includes a semiconductor device area; forming a plurality of films over the silicon wafer; forming a semiconductor device in the semiconductor device area in the plurality of films; and forming a crack prevention pattern extending through the plural films in the scribe lane area.

DRAWINGS

Figure 1:
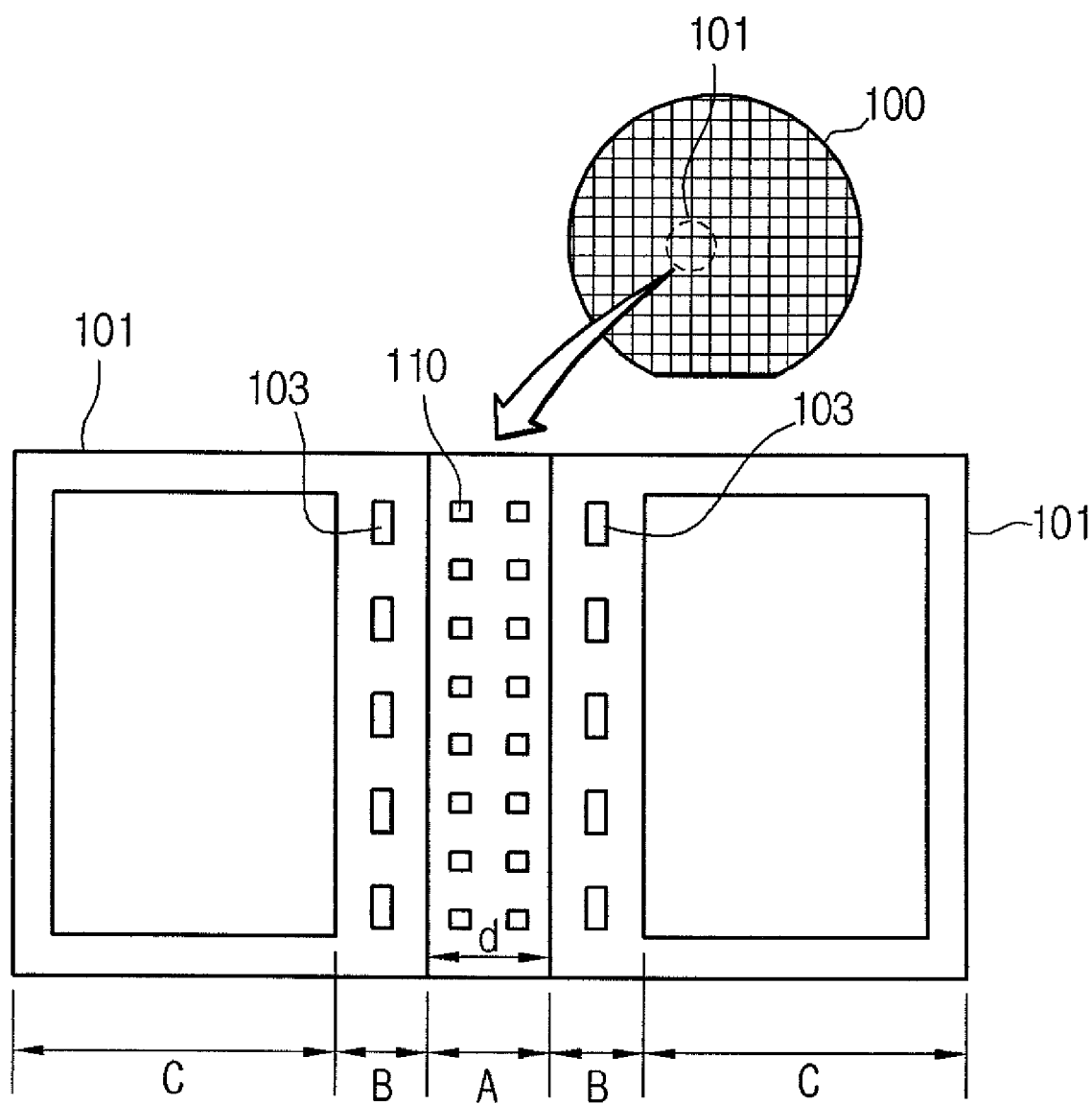

Example FIG. 1 is a plan view showing a portion of a wafer according to embodiments.

Figure 2:
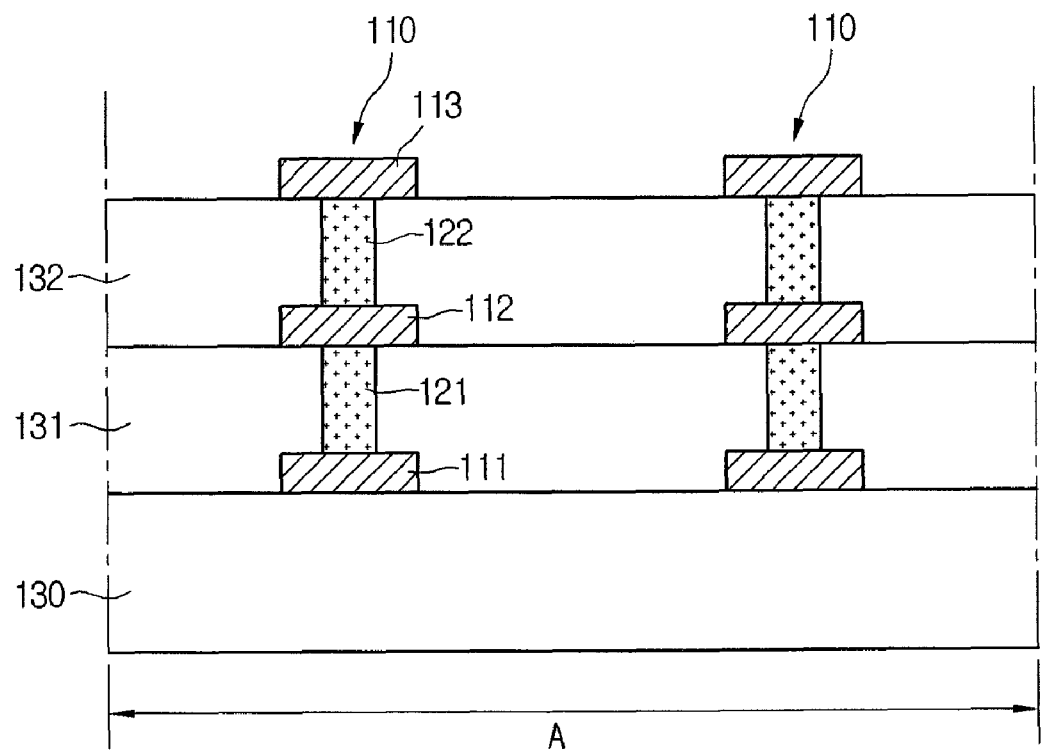

Example FIG. 2 is a sectional view showing a crack prevention pattern according to embodiments.

Figure 3A:
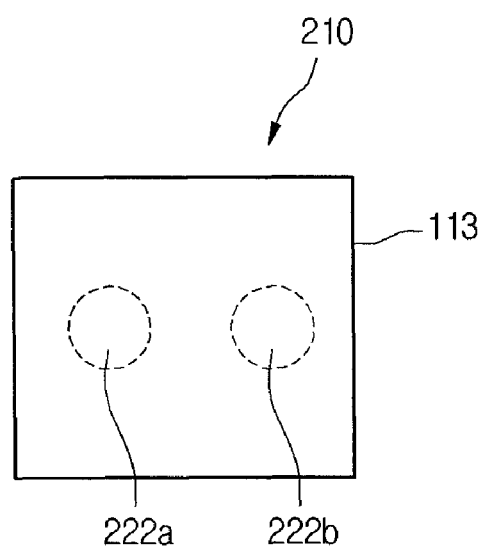
Figure 3B:
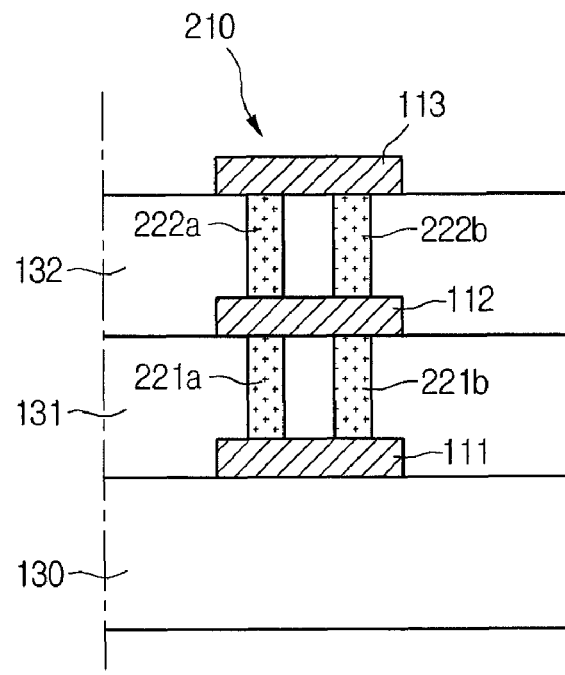

Example FIGS. 3A and 3B are a plan view and a sectional view showing a crack prevention pattern of a wafer according to embodiments.

Figure 4A:
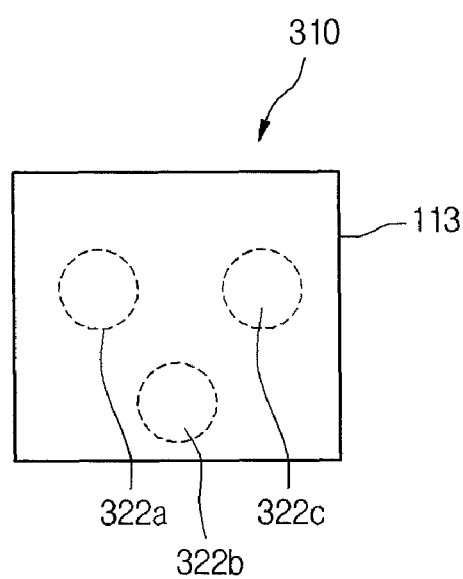
Figure 4B:
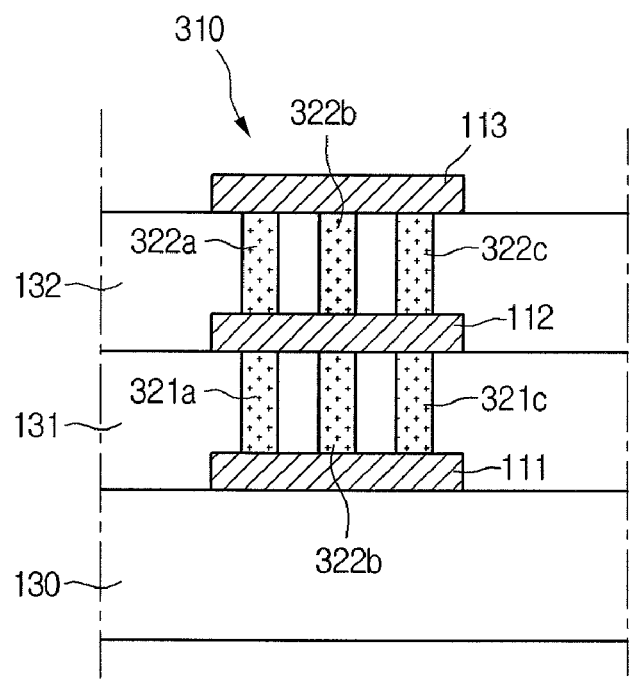

Example FIGS. 4A and 4B are a plan view and a sectional view showing a crack prevention pattern of a wafer according to embodiments.

Figure 5:
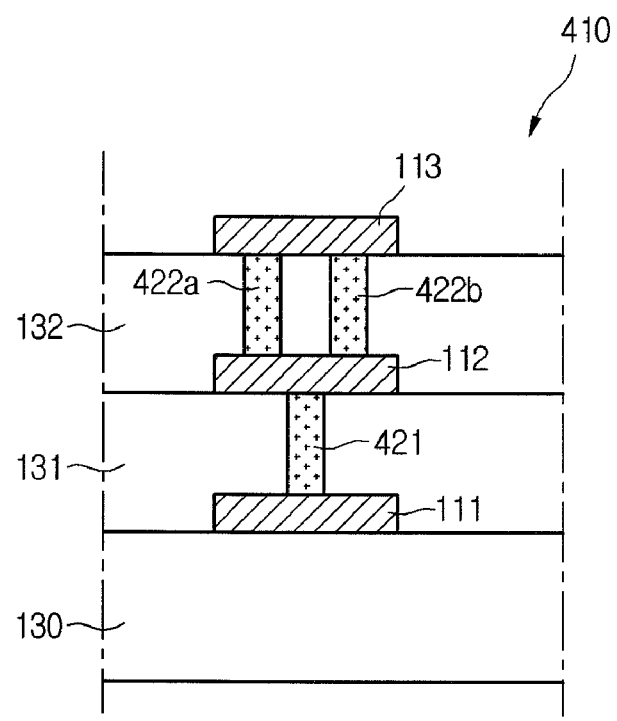

Example FIG. 5 is a sectional view showing a crack prevention pattern of a wafer according to embodiments.

DESCRIPTION

Example FIG. 1 is a plan view showing a portion of a wafer according to embodiments, and example FIG. 2 is a sectional view showing a crack prevention pattern according to embodiments. Referring to example FIG. 1, a plurality of chips 101 may be formed on a wafer 100. The chips 101 on the wafer 100 may be cut into individual chips along a scribe lane. The chip 101 may include a device area C for the formation of a semiconductor device, a pad area B for the formation of a pad to apply electrical signals to device area C, and a scribe lane area A to separate the chips (101) from each other. At least one crack prevention pattern 110 may be formed in the scribe lane area A along the pad area B. The crack prevention pattern 110 may be formed between the pad 103 and the scribe lane area A. The scribe lane area A may have a width in a range of about 50 μm to 150 μm. The crack prevention pattern 110 may have a width d in a range of about 10 μm to 20 μm.

Referring to example FIG. 2, the crack prevention patterns 110 are formed from the bottom layer of the wafer 100 to the top layer of the wafer 100. A first insulating layer 131 is formed over a silicon substrate 130, and a second insulating layer 132 is formed over the first insulating layer 131. Embodiments are not limited to the first and second insulating layers 131 and 132, and additional films and layers may be formed according to the structure of a chip to be manufactured. Even with additional films and layers, the crack prevention pattern 110 may be formed from the bottom layer of a wafer to the top layer of the wafer.

The crack prevention pattern 110 includes a first pattern 111 formed over the silicon substrate 130, a first via pattern 121 formed in the first insulating layer 131 and connected to the first pattern 111, a second pattern 112 formed over the first insulating layer 131 and connected to the first via pattern 121, a second via pattern 122 formed in the second insulating layer 132 and connected with the second pattern 112, and a third pattern 113 formed over the second insulating layer 132 and connected to the second via pattern 122. The first to third patterns 111, 112, and 113 may be the same size or different sizes. The first to third patterns 111, 112, and 113 may vertically overlap with each other over the silicon substrate 130. The first via pattern 121 may have a width in the range of 0.19 μm to 0.36 μm. The first and second via patterns 121 and 122 may be formed perpendicularly to the silicon substrate in correspondence with each other. The crack prevention pattern 110 may have the optimum structure through a 4-point bending test for the wafer 100. The crack prevention pattern 110 may have various structures, and one or plural via patterns may be formed in each insulating layer. Through the 4-point bending test, a crack prevention pattern presenting the highest crack prevention effect for a corresponding wafer can be selected. The number of vias in the first via pattern 121 may be identical to or different from the number of vias in the second via pattern 122. For example, one via pattern 121 and plural second via patterns 122 may be formed.

The first to third patterns 111, 112, and 113, and the first and second via patterns 121 and 122 may be formed while forming a semiconductor device in the device area C on the wafer 100. For example, when forming interconnections of the semiconductor device, the first to third patterns 111, 112, and 113 may be formed. In addition, when forming a via hole or a contact hole in the semiconductor device, the first via pattern 121 and/or the second via pattern 122 may be formed. When forming a copper damascene pattern on one layer of the semiconductor layer, the crack prevention pattern 110 may include a copper damascene pattern on the same layer. The first to third patterns 111, 112, and 113 include aluminum or copper. The first and second via patterns 121 and 122 may include tungsten.

Example FIGS. 3A and 3B are a plan view and a sectional view showing a crack prevention pattern for a wafer according to embodiments. Referring to example FIGS. 3A and 3B, a crack prevention pattern 210 may include a first pattern 111 formed over a silicon substrate 130 and two first via patterns 221a and 221b formed in the first insulating layer 131 and connected to the first pattern 111. A second pattern 112 may be formed over the first insulating layer 131 and connected to the first via patterns 221a and 221b. Two second via patterns 222a and 222b may be formed in a second insulating layer 132 covering the second pattern 112 and connected to the second pattern 112. A third pattern 113 may be formed over the second insulating layer 132 and connected to the second via patterns 222a and 222b. The crack prevention pattern 110 may have a width in a range of 10 μm to 20 μm. The first and second via patterns 221a, 221b, 222a, and 222b may have a width in a range of 0.19 μm to 0.36 μm. The first via patterns 221a and 221b and the second via patterns 222a and 222b may be formed perpendicularly to the silicon substrate in correspondence with each other. The crack prevention pattern 210 may be formed in a scribe lane area A. The crack prevention patterns 210 can be formed in two rows along pad areas at both sides of one scribe lane area A. The interval between the crack prevention patterns 210 and the number of the crack prevention patterns 210 can be optimized through a 4-point bending test.

Example FIGS. 4A and 4B are a plan view and a sectional view showing a crack prevention pattern 310 of a wafer according to embodiments. Referring to example FIGS. 4A and 4B, the crack prevention pattern 310 may include a first pattern 111 formed over a silicon substrate 130, and three first via patterns 321a, 321b, and 321c formed in the first insulating layer 131 and connected to the first pattern 111. A second pattern 112 may be formed over the first insulating layer 131 and connected to the first via patterns 321a, 321b, and 321c. Three second via patterns 322a, 322b, and 322c may be formed in a second insulating layer 132 covering the second pattern 112 and connected to the second pattern 112. A third pattern 113 may be formed over the second insulating layer 132 and connected to the second via patterns 322a, 322b, and 322c. The crack prevention pattern 310 may have a width in a range of about 10 μm to 20 μm. The first and second via patterns 321a, 321b, 321c, 322a, 322b, and 322c may have a width in a range of about 0.19 μm to 0.36 μm. The crack prevention pattern 310 may be formed in a scribe lane area. The crack prevention patterns 310 may be formed in two rows along pad areas at both sides of the scribe lane area.

Example FIG. 5 is a sectional view showing a crack prevention pattern 410 of a wafer according to embodiments. Referring to example FIG. 5, in the crack prevention pattern 410, the number of first via patterns 421 formed on a first insulating layer 131 is different from the number of second via patterns 422a and 422b formed on a second insulating layer 132. As shown in example FIG. 5, a first via pattern 421 and two second via patterns 422a and 422b may be provided. The first via pattern 421 and the second via patterns 422a and 422b may have a structure providing the highest crack prevention effect through a 4-point bending test for the wafer such that crack defects do not occur when a sawing process is performed in the device area. The number of vias in the first via patterns may be identical to or different from the number of vias in second via patterns. The first via patterns may be formed symmetrically or asymmetrically with respect to the second via patterns.

According to embodiments, a semiconductor device having a crack prevention pattern is manufactured such that chip cracking can be prevented in the sawing process. Accordingly, the reliability of the semiconductor device can be improved.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
 a chip including a silicon substrate having a semiconductor device area, a pad area and a scribe lane, the scribe lane defining an outer contour of the chip;
 a semiconductor device formed in the semiconductor device area;
 a pad electrically connected with the semiconductor device and formed in the pad area; and
 a plurality of crack prevention patterns formed in the scribe lane, wherein each one of the crack prevention patterns extends from a lowest portion to a highest portion of the semiconductor device and is formed apart from other crack prevention patterns.

2. The apparatus of claim 1, wherein each one of the crack prevention patterns includes:
 a first pattern formed over the silicon substrate;
 a first insulating layer which covers the first pattern and has a first via pattern connected to the first pattern;
 a second pattern connected to the first via pattern on the first insulating layer;
 a second insulating layer which covers the second pattern and has a second via pattern connected with the second pattern; and
 a third pattern connected with the second via pattern over the second insulating layer.

3. The apparatus of claim 2, wherein the first, second and third patterns have a width in a range of approximately 10 μm to 20 μm.

4. The apparatus of claim 2, wherein the first and second via patterns have a width in a range of approximately 0.19 μm to 0.36 μm.

5. The apparatus of claim 2, wherein the first via pattern has a total number of vias which is equal to a total number of vias in the second via pattern.

6. The apparatus of claim 2, wherein the first to third patterns are substantially the same size.

7. The apparatus of claim 2, wherein the first to third patterns overlap.

8. The apparatus of claim 2, wherein the first and second via patterns are aligned with each other.

9. The apparatus of claim 2, wherein the first via patterns are formed symmetrically with respect to the second via patterns.

* * * * *